(12) United States Patent
Morisue et al.

(10) Patent No.: US 10,279,590 B2
(45) Date of Patent: May 7, 2019

(54) PRESSING METHOD FOR SURFACE OF RESIN LAYER

(71) Applicant: CANON KABUSHIKI KAISHA, Tokyo (JP)

(72) Inventors: Masafumi Morisue, Tokyo (JP); Shinji Kishikawa, Tokyo (JP); Tamaki Sato, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/908,458

(22) Filed: Feb. 28, 2018

(65) Prior Publication Data

US 2018/0250937 A1 Sep. 6, 2018

(30) Foreign Application Priority Data

Mar. 3, 2017 (JP) .................. 2017-040840

(51) Int. Cl.
| | |
|---|---|
| *B41J 2/16* | (2006.01) |
| *G03F 7/00* | (2006.01) |
| *B29C 59/02* | (2006.01) |
| *G03F 7/038* | (2006.01) |
| *G03F 7/039* | (2006.01) |
| *G03F 7/16* | (2006.01) |
| *G03F 7/20* | (2006.01) |
| *G03F 7/32* | (2006.01) |

(Continued)

(52) U.S. Cl.
CPC ............ *B41J 2/1637* (2013.01); *B29C 59/022* (2013.01); *B29C 59/026* (2013.01); *B30B 15/02* (2013.01); *B41J 2/162* (2013.01); *B41J 2/1631* (2013.01); *B41J 2/1635* (2013.01); *G03F 7/0002* (2013.01); *G03F 7/038* (2013.01); *G03F 7/039* (2013.01); *G03F 7/16* (2013.01); *G03F 7/168* (2013.01); *G03F 7/20* (2013.01); *G03F 7/32* (2013.01); *B29K 2009/00* (2013.01); *B29K 2033/12* (2013.01); *B29K 2707/00* (2013.01); *B29K 2709/02* (2013.01); *B29L 2031/767* (2013.01); *B41J 2202/22* (2013.01)

(58) Field of Classification Search
None
See application file for complete search history.

(56) References Cited

U.S. PATENT DOCUMENTS

| | | | | |
|---|---|---|---|---|
| 2011/0239462 A1* | 10/2011 | Saito | ............... | B41J 2/1628 29/890.1 |
| 2016/0001551 A1* | 1/2016 | Chen | ............... | B41J 2/1601 347/47 |

(Continued)

FOREIGN PATENT DOCUMENTS

JP 2006-137065 A 6/2006

*Primary Examiner* — Angel Roman
(74) *Attorney, Agent, or Firm* — Canon U.S.A. Inc., IP Division

(57) ABSTRACT

A pressing method for pressing a surface of a resin layer includes pressing a surface of a resin layer of a wafer using a pressing member, which is to be divided into a plurality of liquid ejection head chips, the wafer including a substrate and the resin layer to serve as an ejection port forming member provided on the substrate. The pressing of the surface of the resin layer is performed by positioning a structure closer to a circumference of the wafer than to an area that becomes the plurality of liquid ejection head chips on the substrate, the structure being in contact with the resin layer.

20 Claims, 16 Drawing Sheets

(51) Int. Cl.
*B30B 15/02* (2006.01)
*B29K 33/00* (2006.01)
*B29L 31/00* (2006.01)
*B29K 707/00* (2006.01)
*B29K 709/02* (2006.01)
*B29K 9/00* (2006.01)

(56) References Cited

U.S. PATENT DOCUMENTS

| | | | |
|---|---|---|---|
| 2016/0163884 A1* | 6/2016 | Sorrieul | H01L 31/186 |
| | | | 257/434 |
| 2018/0222202 A1* | 8/2018 | Mourey | B41J 2/1603 |
| 2018/0269174 A1* | 9/2018 | Fathi | H01L 24/29 |

* cited by examiner

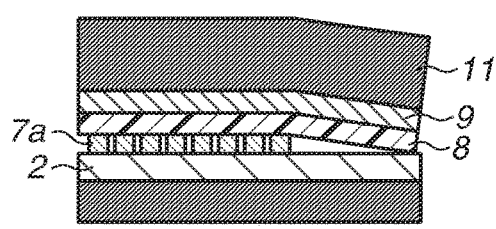
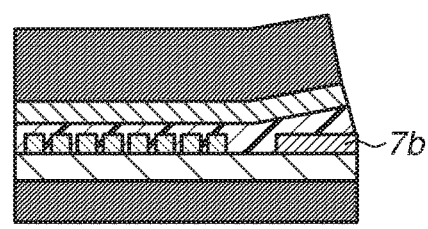
FIG.6A  FIG.6B
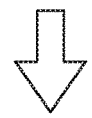
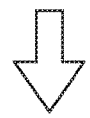
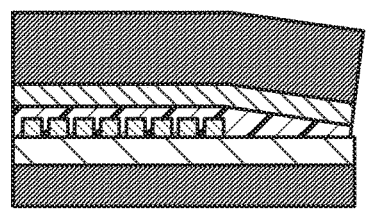
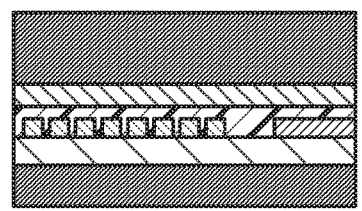

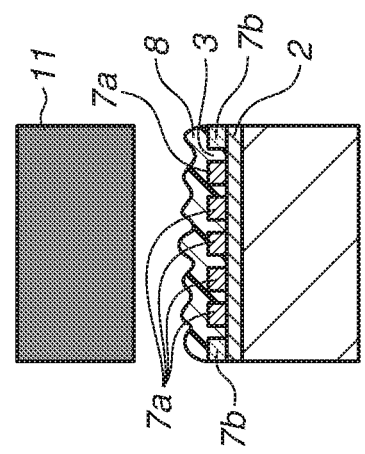
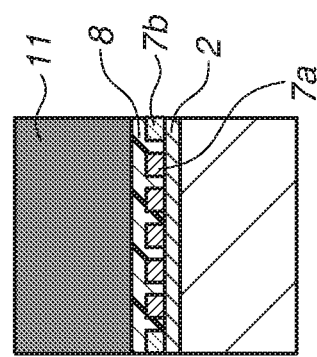
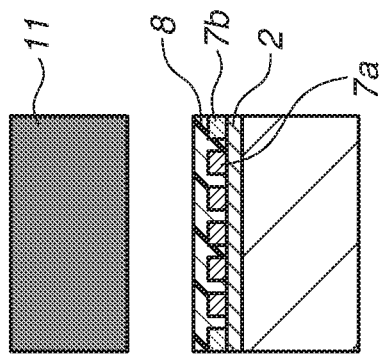

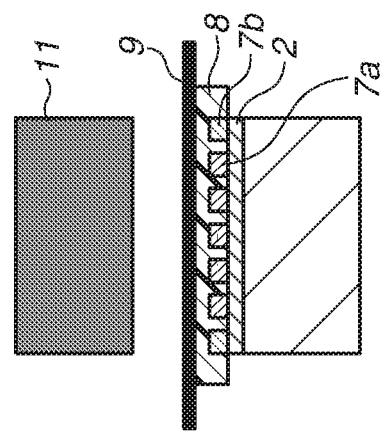
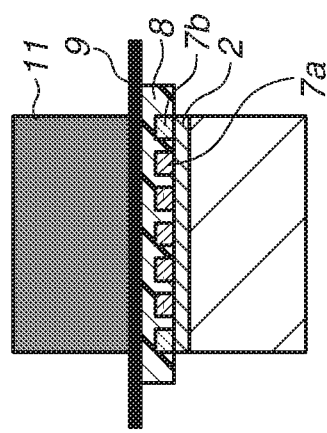
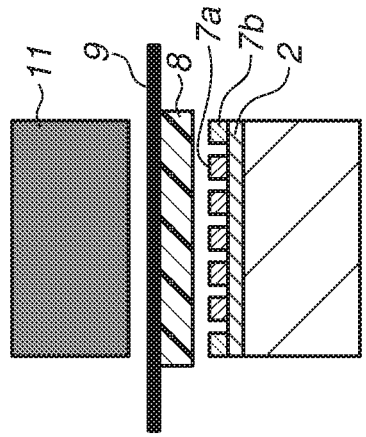
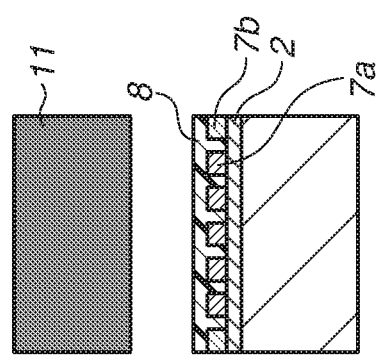
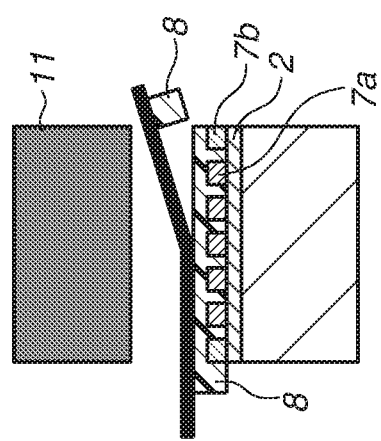

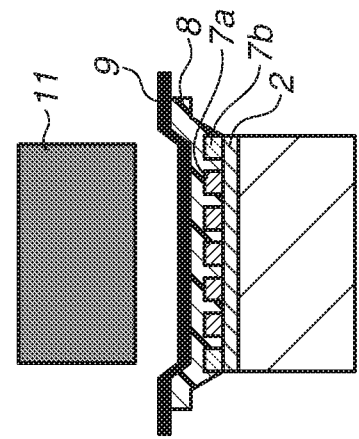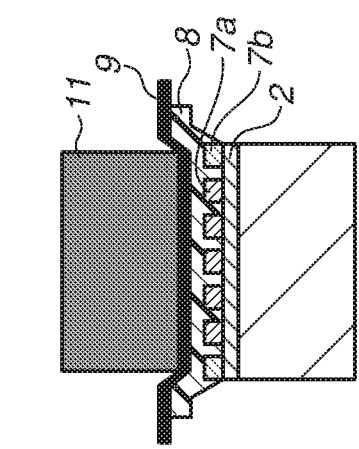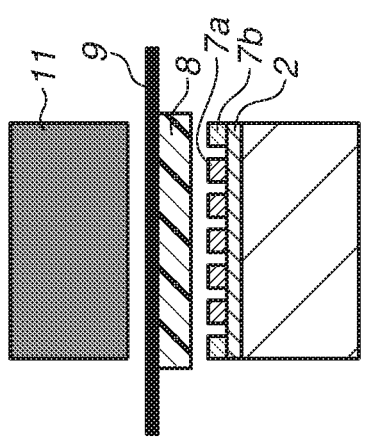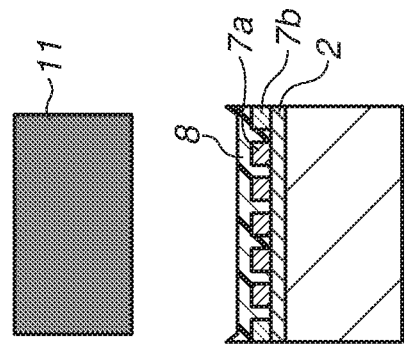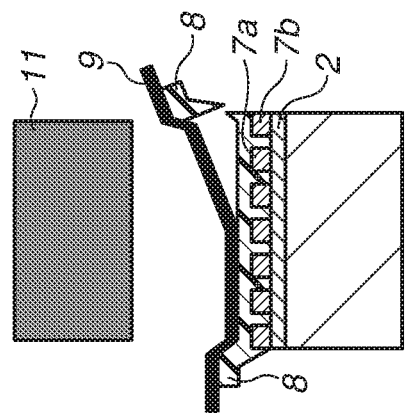

PRESSING METHOD FOR SURFACE OF RESIN LAYER

BACKGROUND OF THE INVENTION

Field of the Invention

The present disclosure relates to a pressing method for pressing a surface of a resin layer of a wafer.

Description of the Related Art

Liquid ejection devices (typically, inkjet recording devices) include a liquid ejection head that ejects liquid. The liquid ejection head includes a liquid ejection head chip known as a recording element substrate. Generally, a plurality of liquid ejection head chips is formed from a single wafer. Some wafers include a substrate and a resin layer, which is provided on the substrate and forms an ejection port. Such a wafer is divided into individual liquid ejection head chips to make the plurality of liquid ejection head chips.

In a manufacturing process for such liquid ejection head chips, a surface of the resin layer which forms the ejection port may be pressed by a flat member, so that the surface of the resin layer can be flattened. In the surface of the resin layer, ejection ports are opened (ejection port surface). Thus, the pressing flattens the ejection port surface, which results in stable liquid ejection. Japanese Patent Application Laid-Open No. 2006-137065 discusses a method for manufacturing a liquid ejection head showing stable ejection characteristics. More specifically, a dry film (resin layer), which forms the ejection port, is stacked under pressure so that a flat ejection port surface can be obtained.

SUMMARY OF THE INVENTION

A pressing method for pressing a surface of a resin layer includes pressing a surface of a resin layer of a wafer, with a pressing member, which is to be divided into a plurality of liquid ejection head chips, the wafer including a substrate and the resin layer to serve as an ejection port forming member provided on the substrate. The pressing of the surface of the resin layer is performed by placing a structure closer to a circumference of the wafer than to an area that becomes the plurality of liquid ejection head chips on the substrate, the structure being in contact with the resin layer.

Further features of the present disclosure will become apparent from the following description of exemplary embodiments with reference to the attached drawings.

BRIEF DESCRIPTION OF THE DRAWINGS

FIGS. 6A and 6B are diagrams illustrating a difference in a thickness of a resin layer in a wafer end portion, depending on presence or non-presence of a subject structure.

FIGS. 8A, 8B, and 8C are diagrams illustrating how the surface of the resin layer of the wafer is pressed to be flattened.

FIGS. 9A to 9E are diagrams illustrating how the surface of the resin layer of the wafer is pressed, and how a supporting member is peeled off.

FIGS. 11A to 11E are diagrams illustrating how the surface of the resin layer of the wafer is pressed to be flattened.

DESCRIPTION OF THE EMBODIMENTS

Conditions including significantly high temperature, high pressure, and a long period of time are required in providing and flattening a surface of a resin layer, which forms the ejection port on an uneven substrate. If the surface of the resin layer is pressed with a pressing member as discussed in Japanese Patent Application Laid-Open No. 2006-137065 under such conditions, the resin layer surface may be surely flattened such that micro unevenness on the surface is likely to be eliminated. However, the present inventors have found that the resin in the resin layer flows in a direction from a center side of the wafer to a circumference of the wafer. As a result, thickness of the resin layer is reduced at a position close to the circumference, which may lead to macro unevenness caused by large undulations of the resin layer surface of the wafer as a whole.

The present disclosure is directed to providing a method for pressing the surface of the resin layer by using a pressing member, which less likely produces unevenness on the surface of the resin layer.

An exemplary embodiment of the present disclosure is described below.

Figure 1:
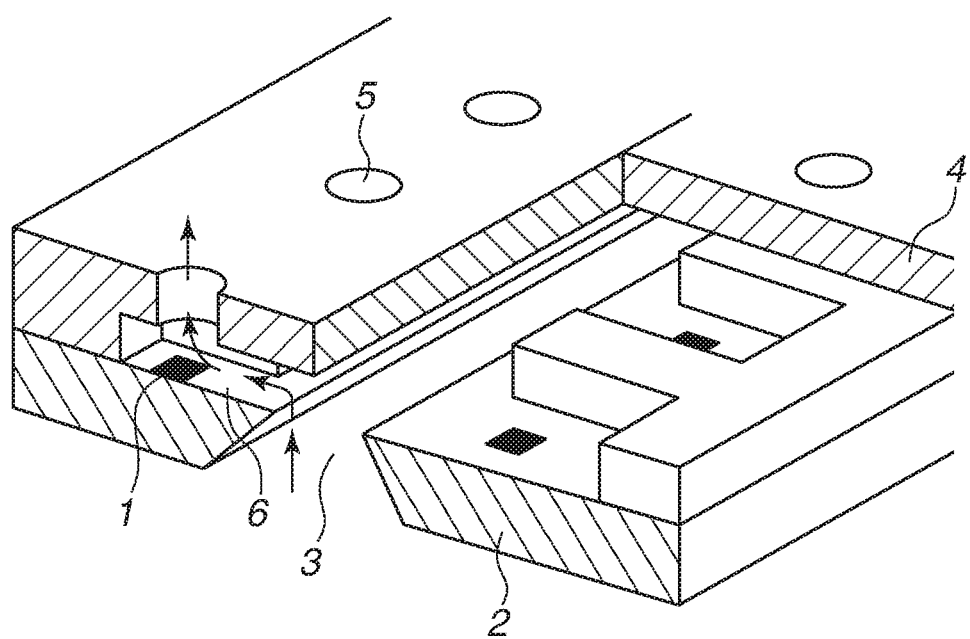
FIG. 1 is a perspective view of a liquid ejection head chip.

FIG. 1 is a perspective view of a liquid ejection head. A liquid ejection head chip includes an energy generation element 1 on a substrate 2. The energy generation element 1 generates energy required for ejection, and includes a heating resistance element or a piezoelectric element. For example, the substrate 2 is a single crystal silicon substrate. The substrate 2 has a supply port 3 formed through the substrate 2. The supply port 3 is configured to supply liquid to a flow path 6 on the substrate 2. The liquid supplied to the flow path 6 receives energy from the energy generation element 1 to be ejected through ejection ports 5 formed in an ejection port forming member 4. The ejection port forming member 4 is formed of a resin layer. The resin layer is patterned through a process such as photolithography to be the ejection port forming member 4 for the ejection ports 5. In the ejection port forming member 4 of the liquid ejection head chip illustrated in FIG. 1 the flow path 6 is formed in addition to the ejection port 5.

Figure 3:
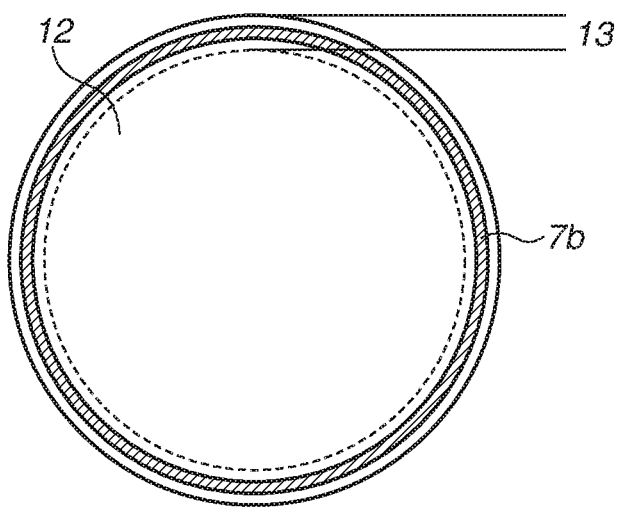
FIG. 3 is a diagram illustrating a surface of the wafer.

A plurality of the liquid ejection head chips illustrated in FIG. 1 is simultaneously formed in a single wafer. Then, the wafer is divided into individual liquid ejection head chips to form the plurality of liquid ejection head chips. Generally, the water has a cylindrical shape with a circular cross-sectional shape as illustrated in FIG. 3.

FIG. 2 illustrates how the liquid ejection head chip is formed on the wafer. FIG. 2 is an enlarged cross-sectional view of a circumference portion of the wafer. First of all, the substrate 2 is prepared as illustrated in FIG. 2A. The substrate 2 is provided with a pattern-forming material 7a for forming the flow path 6 and a structure 7b positioned closer to the circumference of the wafer than to the pattern-forming material 7a. The pattern-forming material 7a is eventually removed to become the flow path 6, and is formed of positive photosensitive resin and metal such as aluminum. When the pattern-forming material 7a is formed of the positive photosensitive resin, the positive photosensitive resin is applied to the wafer or formed by attaching a dry film on the wafer, and is patterned into a shape of the flow path 6 by way of photolithography. For example, the positive photosensitive resin is polymethyl isopropenyl ketone or a copolymer of methacrylic acid and methacrylate. The structure 7b is described in detail below.

Figure 2A:
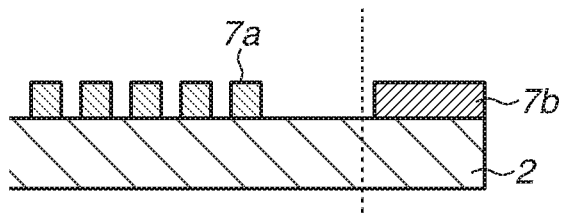
FIGS. 2A to 2F are diagrams illustrating how the liquid ejection head chip is formed on a wafer.

An area in FIG. 2A including the pattern-forming material 7a becomes the liquid ejection head chip. An area including the structure 7b is an area that does not become the liquid ejection head chip. A dotted line in FIG. 2A indicates a boundary position between these areas. The area that becomes the liquid ejection head chip is a portion of the wafer to be used as the liquid ejection head chip after the wafer is divided. The area that does not become the liquid ejection head chip is a portion of the wafer that is not used as the liquid ejection head chip after the wafer is divided. For example, a portion along the circumference of the wafer is such an area.

Figure 2B:
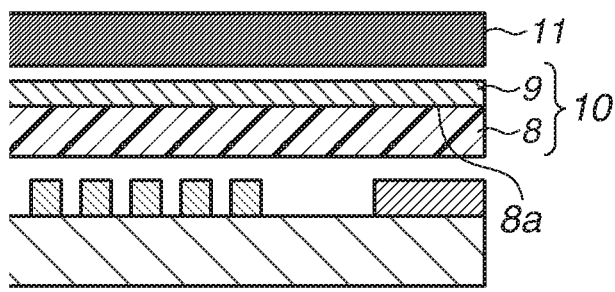

Next, as illustrated in FIG. 2B, a transfer member 10 is prepared in such a manner that it faces the substrate 2. The transfer member 10 includes a supporting member 9 and a resin layer 8 formed on and supported by the supporting member 9. For example, a composition including resin is applied on the supporting member 9 and baked to form the resin layer 8. The resin layer 8 is a layer which becomes the ejection port forming member 4, and may be formed of any resin. Still, negative photosensitive resin is preferably used which is suitable for the ejection port forming member 4. As the negative photosensitive resin, resin including epoxy group, oxetane group, vinyl group, or the like can be used, and preferably includes a polymerization initiator corresponding to these. A material of the supporting member 9 includes an organic film material such as polyethylene terephthalate and polyimide. Furthermore, an inorganic substrate such as quartz or silicon wafer may be used.

Figure 2C:
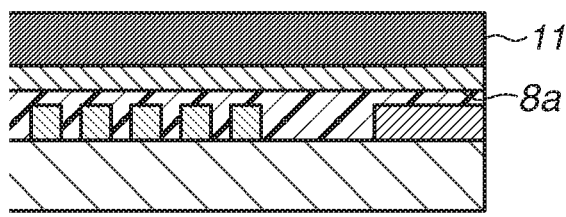
Figure 7:
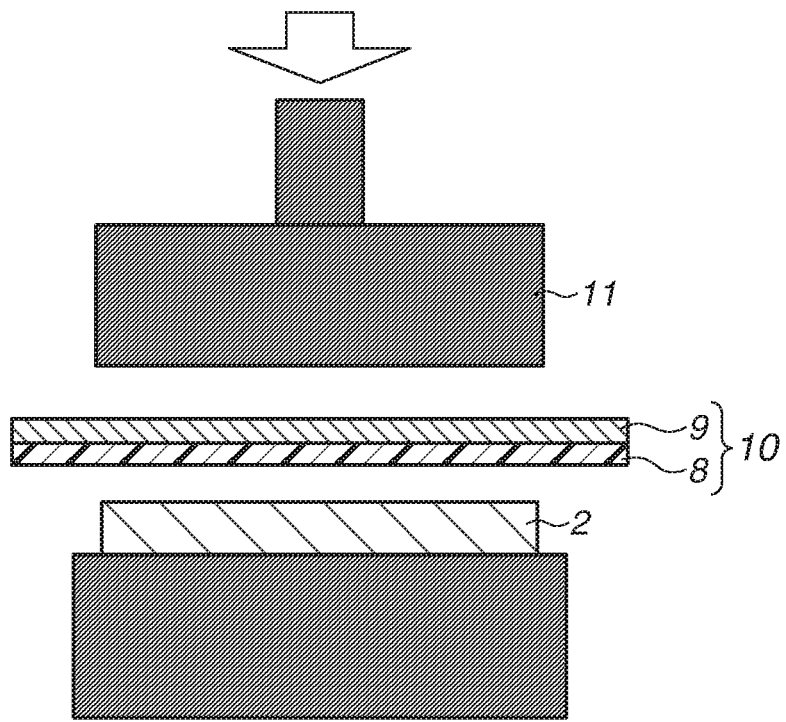
FIG. 7 is an overall view of a process of pressing the wafer with a pressing member.

The resin layer 8 of the transfer member 10 is arranged to face the substrate 2, and then a pressing member 11 presses the transfer member 10 as illustrated in FIG. 2C. This state is maintained for a predetermined period of time. FIG. 7 illustrates an overall view including the pressing member 11. The resin layer 8 thus pressed by the pressing member 11 covers the pattern-forming material 7a and the structure 7b, while being in contact with the surface of the substrate 2. Thus, a surface 8a of the resin layer 8 thus pressed is pressed against the pressing member 11 across the supporting member 9 of the transfer member 10. The pressing member 11 preferably has a flat pressing surface (flat plate). In this manner, the resin layer 8 is transferred onto the substrate 2. The transfer member 10 including the supporting member 9, is preferably a dry film. In this case, the resin layer 8 solidifies at a normal temperature (25° C.). At the time of transferring, the dry film may be in a partially molten state.

Figure 2D:
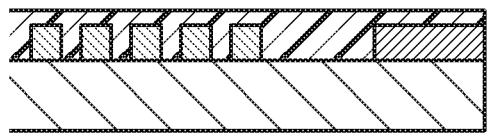

Next, the pressing member 11 is separated from the transfer member 10, and then the supporting member 9 is peeled off the resin layer 8, whereby a state illustrated in FIG. 2D is obtained.

Figure 2E:
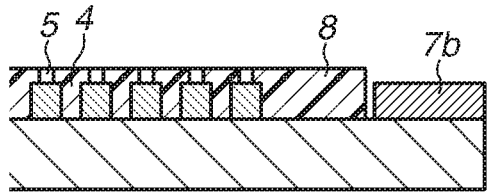

Next, as illustrated in FIG. 2E, the ejection ports 5 are formed in the resin layer 8 by way of photolithography, in which the resin layer 8 serves as the ejection port forming member 4. In this process, the structure 7b is exposed.

Figure 2F:
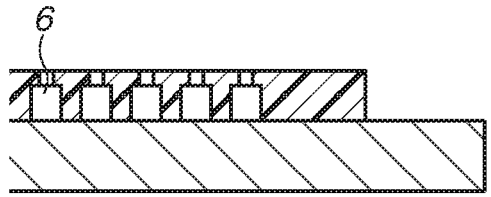

Next, the structure 7b and the pattern-forming material 7a are removed with developer or the like, so that the flow path 6 is formed as illustrated in FIG. 2F.

Finally, the supply port 3 as illustrated in FIG. 1 (not illustrated in FIG. 2) is formed, and the wafer is cut into individual liquid ejection head chips. In this manner, the liquid ejection head chips are manufactured.

A feature of the present disclosure is that the structure 7b is provided, which comes into contact with the resin layer 8, at a position closer to the circumference of the wafer than to the area that becomes the plurality of liquid ejection head chips, and in this state the pressing member 11 presses the surface 8a of the resin layer 8. FIG. 6A illustrates a result of the pressing when the structure 7b is not provided, whereas FIG. 6B illustrates a result of the pressing when the structure 7b is provided. Upper charts in FIG. 6A and FIG. 6B illustrate an initial state of the pressing and lower charts illustrates a state after the pressing has been performed for a predetermined period of time. If the structure 7b is not positioned closer to the circumference of the wafer than to the area that becomes the liquid ejection head chip as illustrated in FIG. 6A, the thickness of the resin layer 8 is smaller in a portion around the circumference of the wafer than in a portion around the center of the wafer because the pressing action causes the resin in the resin layer 8 to flow due to the lack of the pattern-forming material 7a. When the pressing is performed for a predetermined period of time, flow resistance increases, leading to lower resin flowability. However, the height of the resin layer 8 from the surface of the substrate 2 is low in the portion around the circumference of the wafer. Thus, while the pressing can eliminate micro unevenness on the surface of the resin layer 8, macro unevenness (the difference in the height of the resin layer 8 between the portion around the center of the wafer and the portion around the circumference) adversely appears. In view of this, the structure 7b is provided at a position closer to the circumference of the wafer than to the area that becomes the liquid ejection head chip as illustrated in FIG. 6B. Thus, the portion around the circumference of the wafer can be put under a condition similar to the portion around the center of the wafer, and thus the thickness of the resin layer 8 is less likely to become small. In particular, if the structure 7b has a larger area than the pattern-forming material 7a, the resin layer 8 may be higher in the circumference portion of the wafer than in the portion around the center of the wafer. When the pressing is performed for a predetermined period of time in this state, while the thickness of the resin layer 8 in the portion around the circumference gradually decreases, the flow resistance sharply increases, which leads to lower resin flowability. Thus, a degree of its change gradually decreases as the pressing time elapses. As a result, the resin layer 8 can have a uniform height from the surface of the substrate 2. Thus, both micro unevenness and macro unevenness of the resin layer 8 on the surface can be prevented from occurring.

An advantageous effect obtained by providing the structure 7b close to the circumference of the wafer in terms of resin flowability in the resin layer 8 will be described. The structure 7b provided close to the circumference of the wafer results in low resin flowability in the portion around the circumference of the wafer when the surface of the resin layer 8 is pressed by the pressing member 11. This phenomenon is caused due to a small distance between the structure 7b and the supporting member 9. When the resin flowability is low in the portion around the circumference, the resin is less likely to flow out from the wafer. Thus, the thickness of the resin layer 8 is less likely to decrease in the portion around the circumference of the wafer.

FIG. 3 is a diagram illustrating a surface of the wafer. An area of the wafer on a center side is an area (chip effective area) 12 that becomes the liquid ejection head chip, and an area of the wafer on a circumference side is an area (non-chip-effective area) 13 that does not become the liquid ejection head chip. The structure 7b only has to be provided at a position that is closer to the circumference of the wafer than to the area that becomes the liquid ejection head chip. However, the structure 7b preferably has a shape following the circumference of the wafer as illustrated in FIG. 3. The structure 7b having the shape following the circumference of the wafer can more effectively ensure uniform resin flow resistance in the portion around the circumference within the wafer surface. Thus, the surface 8a of the resin layer 8 can show higher flatness. The wafer generally has a circular surface. Thus, the structure 7b having the shape following the circumference of the wafer has a loop shape. While the structure 7b may have a discontinuous shape which shows a gap along the circumference of the wafer, but the structure 7b preferably has a seamless and continuous shape.

Figure 4A:
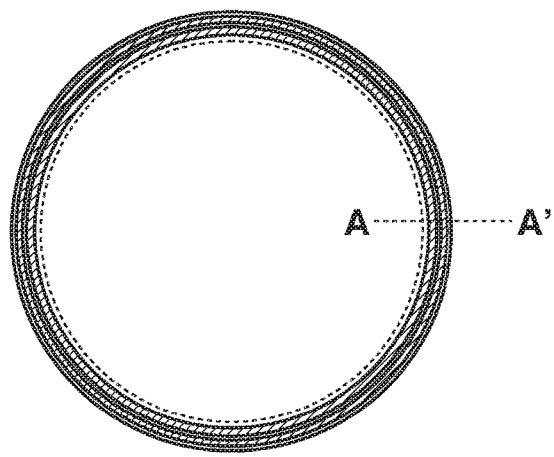
FIGS. 4A and 4B are a diagram illustrating the surface of the wafer and a cross-sectional view of a portion around a circumference.
Figure 4B:
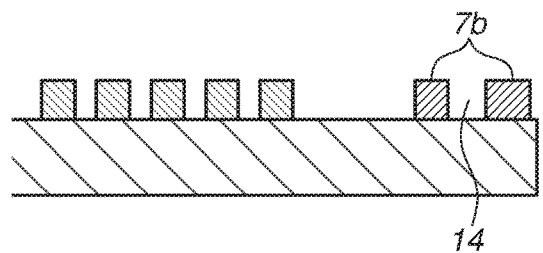

FIG. 4A is a diagram illustrating a surface of a wafer, and FIG. 4B is a cross-sectional view taken along the line A-A' in FIG. 4A. The wafer illustrated in FIG. 4 has two layers of the structures 7b arranged in a direction toward the circumference of the wafer, with a gap 14 provided in between. To prevent the thickness of the resin layer 8 to decrease in the portion close to the circumference of the wafer, the flow resistance of the resin is preferably set to be high and the structure 7b preferably has a larger area (i.e., longer in the cross-section taken along the line A-A'). However, the structure 7b having an excessively large area might lead to an excessively large thickness of the resin layer 8 in the portion around the circumference of the wafer that might affect the shape of the ejection port forming member 4 in the portion around the circumference of the wafer. In view of this, multiple structures 7b are arranged along the direction toward the circumference of the wafer with the gap 14 provided in between. Thus, the size of the structure 7b is adjusted so that the thickness can be prevented from excessively increasing in the portion around the circumference of the wafer.

Figure 5A:
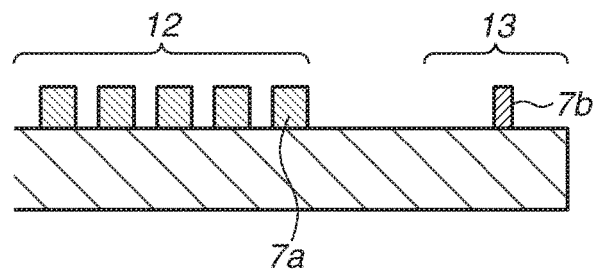
FIGS. 5A and 5B are cross-sectional views of the portion around the circumference of the wafer.
Figure 5B:
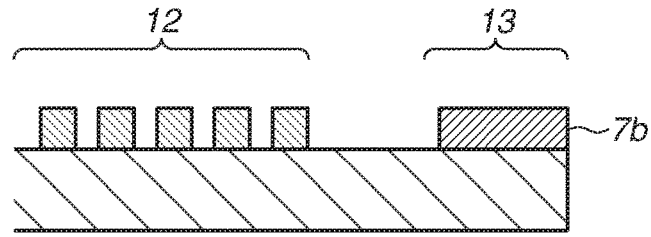

FIG. 5 is a cross-sectional view of the wafer of the same portion as that illustrated in FIG. 4B. To adjust the thickness of the resin layer 8 with the size of the structure 7b, the structure 7b in the non-chip-effective area 13 preferably has a larger volume density than the pattern-forming material 7a in the chip effective area 12. A larger size of the structure 7b is likely to lead to a larger thickness of the resin layer 8 in the portion around the circumference of the wafer. Still, the thickness tends to decrease as the pressing time elapses as described above. Thus, when the non-chip-effective area 13 is thicker than the chip effective area 12 in the pressing initial state, the resin layer 8 can have a uniform thickness over the chip effective area 12 and the non-chip-effective area 13 by optimizing a condition regarding the pressing time. For example, a configuration illustrated in FIG. 5B, in which the structure 7b in the non-chip-effective area 13 has a larger area (longer length) than the pattern-forming material 7a, is more preferable than a configuration illustrated in FIG. 5A, in which the structure 7b has a smaller area (shorter length) than the pattern-forming material 7a.

The structure 7b and the pattern-forming material 7a are preferably made of the same material to be simultaneously formed for the sake of manufacturing efficiency. For example, the pattern-forming material 7a and the structure 7b made of the same material are obtained by dividing a resin layer applied on the substrate 2 into the pattern-forming material 7a and the structure 7b.

Alternatively, the pattern-forming material 7a and the structure 7b may be made of different materials. In this configuration, the structure 7b is preferably made of a material harder than a material of the pattern-forming material 7a, when the flattening of the resin layer 8 using the structure 7b is prioritized.

The surface of the resin layer 8 is pressed not only when the resin layer 8 is transferred onto the substrate 2, but may also be pressed to flatten the surface 8a of the resin layer 8 that has been provided on the substrate 2. FIG. 8 illustrates the latter case. More specifically, FIG. 8 is a schematic cross-sectional view of the wafer as a whole.

As illustrated in FIG. 8A, the resin layer 8 is formed to cover the pattern-forming material 7a and the structure 7b on the substrate 2. This resin layer 8 is not formed by attaching (pressing) a dry film, but is formed by applying and drying a composition, which becomes the resin layer 8, on the substrate 2. Thus, in the illustrated state, the surface of the resin layer 8 has not been pressed yet. The pattern-forming material 7a and the structure 7b are the same as those described above. The pressing member 11 is provided above facing the surface of the resin layer 8. A base member is provided below the substrate 2.

Next, the pressing member 11 presses the surface 8a of the resin layer 8 as illustrated in FIG. 8B. After the pressing is performed for a predetermined period of time, the pressing member 11 is separated from the surface of the resin layer 8 as illustrated in FIG. 8C.

Also in this configuration of flattening the surface 8a of the resin layer 8, since the structure 7b is provided, the surface of the resin layer 8 can be favorably flattened for the same reason as described above.

FIG. 9 is a diagram illustrating how the supporting member 9 is peeled off. Matters that have already been described will not be elaborated below. First of all, the surface of the resin layer 8 is pressed as illustrated in FIGS. 9A to 9C. Then, as illustrated in FIG. 9D, the supporting member 9 is peeled off. In this process, a portion of the resin layer 8 that has been in contact with the substrate 2 remains on the substrate 2, and a portion of the resin layer 8 that has not been in contact with the substrate 2 remains on the supporting member 9. In this manner, the resin layer 8 that is on the outer side than the circumference of the wafer is can be more favorably removed.

Figure 10A:
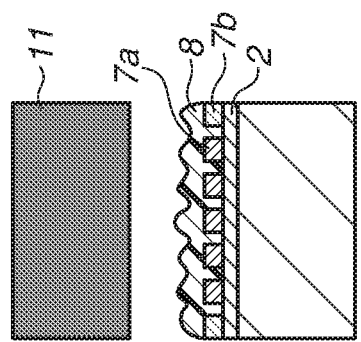
FIGS. 10A, 10B, and 10C are diagrams illustrating how the surface of the resin layer of the wafer is pressed to be flattened.
Figure 10B:
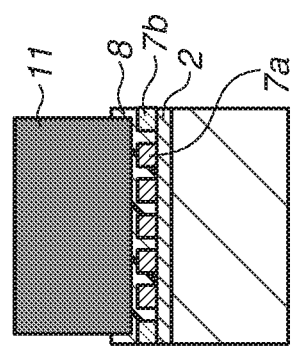
Figure 10C:
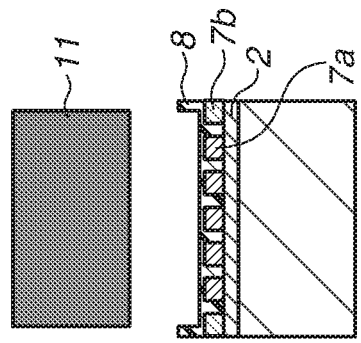

FIG. 10 is a diagram illustrating how the surface 8a of the resin layer 8 on the wafer is pressed and flattened by the pressing member 11, as in FIG. 8. FIG. 10 is different from FIG. 8 in that the pressing member 11 has a width smaller than that of the width of the substrate 2, which is the width of the wafer. In FIG. 10, the structure 7b having a loop shape is provided along the circumference of the wafer. The pressing member 11 has a circular pressing surface with an end portion positioned to overlap with the structure 7b. In the cross-sectional view in FIG. 10, the pressing member 11 has the end portion provided above the structure 7b. With the end portion of the pressing member 11 thus provided within the substrate 2 in an upper view of the surface of the wafer, force can be prevented from being applied to the resin layer 8 from a portion of the pressing member sticking out from the substrate 2, during the pressing. If such force is applied, thickness of the structure 7b or the resin layer 8 is decreased in the portion around the circumference of the wafer. This might cause the macro unevenness on the surface of the resin layer 8. More preferably, the end portion of the pressing member 11 is provided above the structure 7b as illustrated in FIG. 10. If the end portion of the pressing member 11 is provided on the more inner side than the structure 7b, the resin flowability might not sufficiently decrease. The end portion of the pressing member 11 is provided above the structure 7b. It means that the end portion of the pressing member 11 not only matches the end portion of the structure 7b, but also it means the end portion of the pressing member 11 is provided between inner and outer end portions of the structure 7b. This method of arranging the pressing member 11 to have the end portion overlapping with the structure 7b, and then pressing the surface of the resin layer 8 is not limited to the pressing after the resin layer 8 is formed on the wafer (substrate). For example, with this arrangement, the resin flowability can also be reduced even if the pressing is performed after the resin layer 8 and the structure 7b have been formed on the supporting member 9.

When the surface 8a of the resin layer 8 is pressed across the supporting member 9, the pressing member 11 may have a smaller width than the substrate 2. This is illustrated in FIG. 11. FIG. 11 illustrates a method in which the surface of the resin layer 8 is pressed in a state where the end portion of the supporting member 9 is fixed. The supporting member 9 is peeled off in the same manner as described with reference to FIG. 9.

Figure 12A:
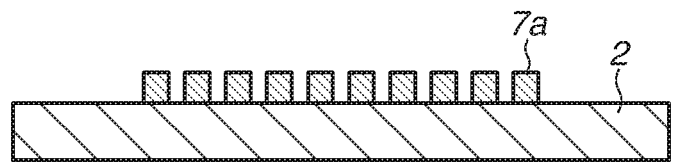
FIGS. 12A to 12F are diagrams illustrating how the surface of the resin layer of the wafer is pressed to be flattened.
Figure 12B:
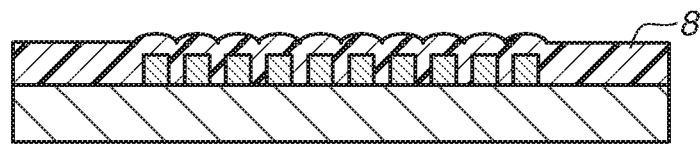

The structure 7b may be formed by exposure of the photosensitive resin. FIG. 12 illustrates an example where the structure 7b is formed by the exposure. First of all, as illustrated in FIG. 12A, the pattern-forming material 7a is formed on the substrate 2, and then the resin layer 8 covering the pattern-forming material 7a is formed as illustrated in FIG. 12B. The resin layer 8 is made of photosensitive resin.

Figure 12C:
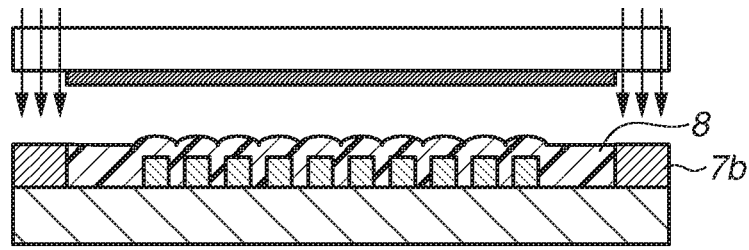

Next, as illustrated in FIG. 12C, the structure 7b is obtained at a position of the resin layer 8 closer to the circumference of the wafer than the area that becomes the liquid ejection head chip, as a result of pattern exposure of the resin layer 8. This structure 7b is a portion of the resin layer 8 made of negative photosensitive resin, cured by the exposure. The structure 7b, which is a part of the resin layer 8, is in contact with a portion of the resin layer 8 not serving as the structure 7b. The structure 7b is formed between the end portion of the substrate 2 and a position separated from the end portion by a predetermined distance.

Figure 12D:
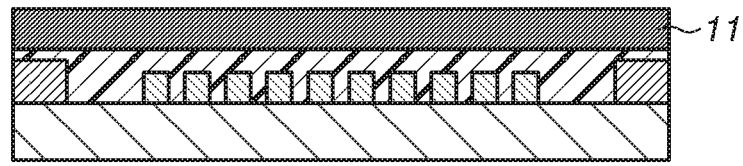
Figure 12E:
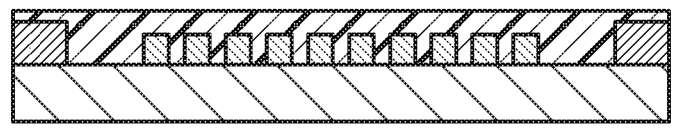
Figure 12F:
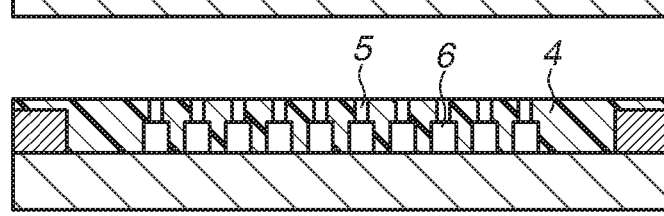
Figure 13A:
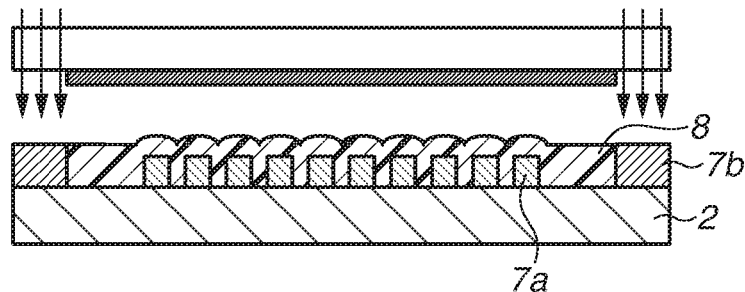
FIGS. 13A to 13F are diagrams illustrating how the surface of the resin layer of the wafer is pressed to be flattened.
Figure 13B:
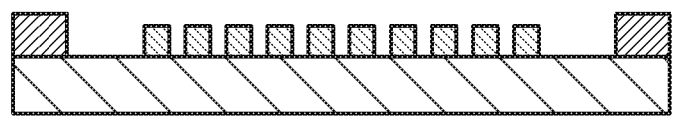
Figure 13C:
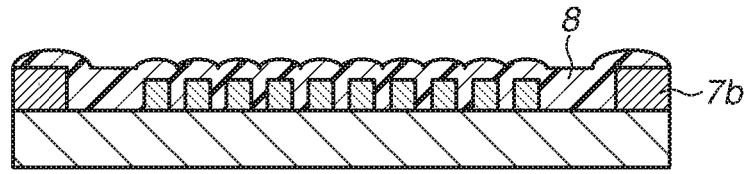
Figure 13D:
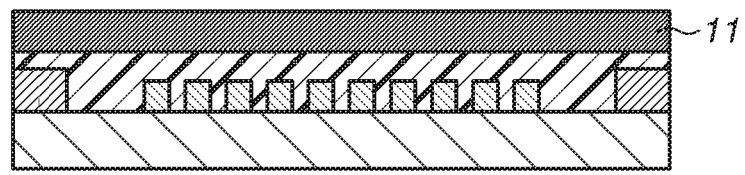
Figure 13E:
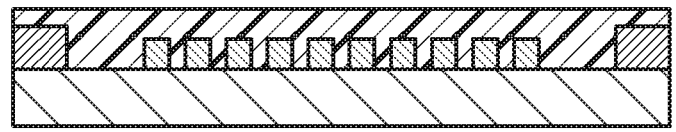
Figure 13F:
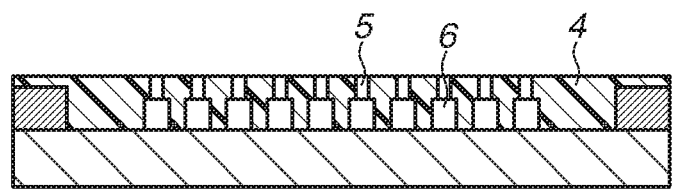

Next, as illustrated in FIG. 12D, the pressing member 11 presses the surface 8a of the resin layer 8. Then, as illustrated in FIG. 12E, the pressing member 11 is separated. Then, the ejection ports 5 are formed in the resin layer 8 so that the resin layer 8 serves as the ejection port forming member 4, and the pattern-forming material 7a are removed with the developer or the like so that the flow path 6 is formed, as illustrated in FIG. 12F. Finally, the supply port 3 and the like are formed, and the wafer is cut into individual liquid ejection head chips. In this manner, the liquid ejection head chips are manufactured.

Figure 14A:
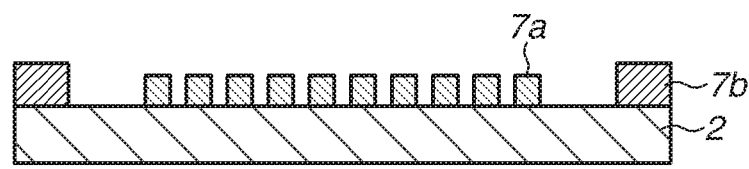
FIGS. 14A, 14B, and 14C are diagrams illustrating how the surface of the resin layer of the wafer is pressed to be flattened.
Figure 14B:
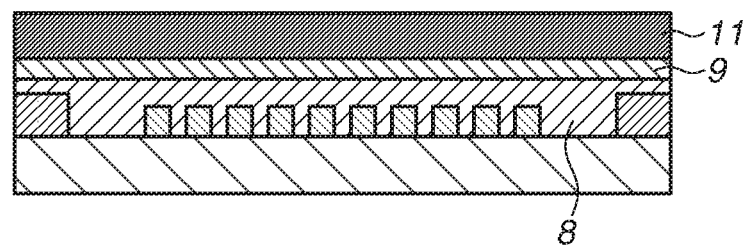
Figure 14C:
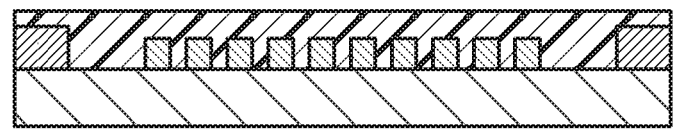

FIG. 13 illustrates a modification of the example described with reference to FIG. 12. FIG. 13A illustrates a state obtained by the same processes as those for obtaining the state illustrated in FIG. 12C. In FIG. 13, the resin layer 8 is temporarily removed as illustrated in FIG. 13B, and the resin layer 8 is newly provided in a process illustrated in FIG. 13C. The resin layer 8 to be newly provided and the temporarily removed resin layer 8 may be made of the same material or may be made of different materials. The processes thereafter are performed in the same manner as that illustrated in FIG. 12 to manufacture the liquid ejection head chips. In this method, the height of the structure 7b can be more freely set than in the method described with reference to FIG. 12. A distance (an ejection port height) between the substrate surface and the ejection port surface is a parameter that largely affects liquid ejection. The method described with reference to FIG. 13 is advantageous in that the height of the structure 7b and the thickness (height) of the resin layer 8, serving as the ejection port forming member 4, corresponding to the ejection port height can be separately set. The method described with reference to FIG. 13 can also be applied to a method in which the surface 8a of the resin layer 8 is pressed when the resin layer 8 is transferred by using the supporting member 9 as illustrated in FIG. 14.

Figure 15A:
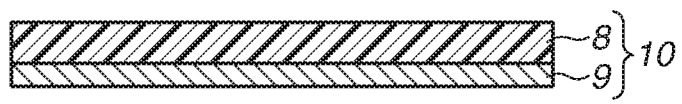
FIGS. 15A to 15F are diagrams illustrating how the surface of the resin layer of the wafer is pressed to be flattened.
Figure 15B:
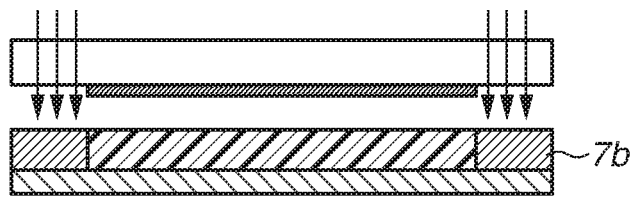

The structure 7b may be formed on the supporting member 9 before the resin layer 8 is transferred. This method is described with reference to FIG. 15. First, as illustrated in FIG. 15A, the transfer member 10 in which the resin layer 8 is formed on the supporting member 9 is prepared. Then, as illustrated in FIG. 15B, the structure 7b is formed in the end portion of the resin layer 8 as a result of pattern exposure on the transfer member 10.

Figure 15C:
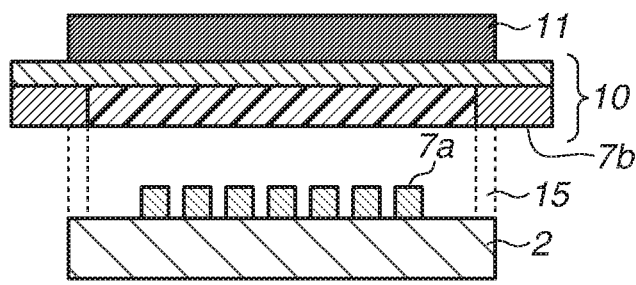

Then, as illustrated in FIG. 15C, the transfer member 10 is arranged to face the substrate 2. The pattern-forming material 7a is already formed on the substrate 2. Here, the pattern-forming material 7a and the structure 7b do not overlap with each other in an upper view of the surface of the substrate 2. The substrate 2 and the structure 7b partially overlap with each other. In FIG. 15C, an area where the substrate 2 and the structure 7b overlap with each other is illustrated as an overlap area 15. The overlap area 15 serves as the area that does not become the liquid ejection head chip (non-chip-effective area) 13.

Figure 15D:
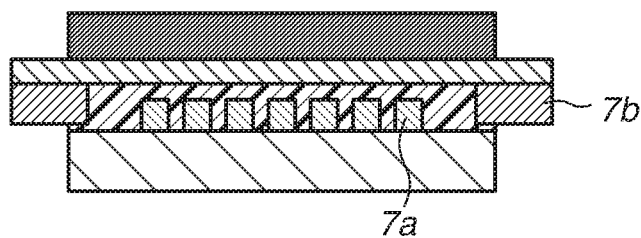

Next, as illustrated in FIG. 15D, the pressing member 11 is used to transfer the resin layer 8 onto the surface of the substrate 2 and to press the surface of the resin layer 8. When the pressing is performed, the structure 7b is positioned closer to the circumference of the wafer than to the pattern-forming material 7a, on the substrate 2.

Figure 15E:
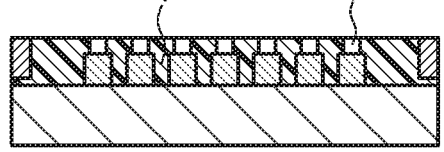

Next, the pressing member 11 is lifted to be separated. Further, the supporting member 9 is peeled off. Then, as illustrated in FIG. 15E, the ejection ports 5 are formed, so that the resin layer 8 serves as the ejection port forming member 4. When the supporting member 9 is peeled off, a part of the structure 7b is peeled off together with the supporting member 9 and the remaining part of the structure 7b remains on the substrate 2.

Figure 15F:
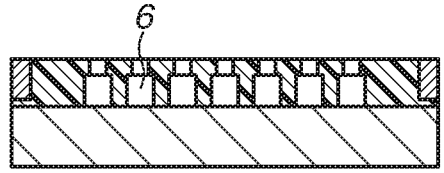

Next, the pattern-forming material 7a is removed using the developer or the like, whereby the flow path 6 is formed as illustrated in FIG. 15F. The processes thereafter are performed in the same manner as those described above.

Figure 16A:
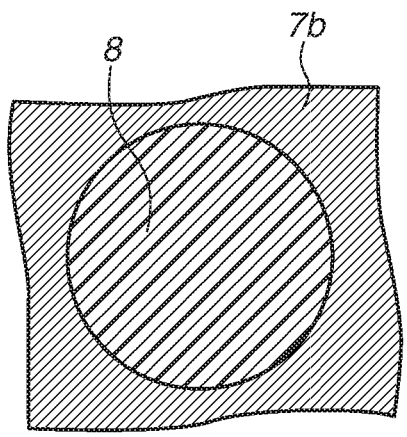
FIGS. 16A, 16B, 16C, and 16D are diagrams illustrating shapes of the subject structure on the supporting member.
Figure 16B:
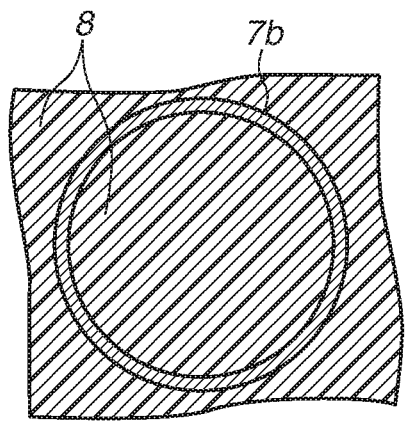

A pattern shape of the structure 7b is described in a case where the structure 7b is formed on the supporting member 9 in the transfer member 10 before the resin layer 8 is transferred. FIG. 16A illustrates an example where an outer side of the resin layer 8 is entirely cured to be the structure 7b. In this example, the portion of the resin layer 8 not in contact with the substrate 2 is entirely cured. Thus, the resin can be prevented from attaching to the device or the like, during the process of transferring the resin layer 8 and the process of peeling off the supporting member 9. However, the entirely cured outer side of the resin layer 8 leads to generation of a large cured area, resulting in large stress applied to the transfer member 10. As a result, undulations or the like might occur on the resin layer 8. Thus, the structure 7b having a loop shape may be provided and the resin layer 8 may be provided on inner and outer sides of the structure 7b as illustrated in FIG. 16B, so that the stress applied on the transfer member 10 can be reduced.

Figure 16C:
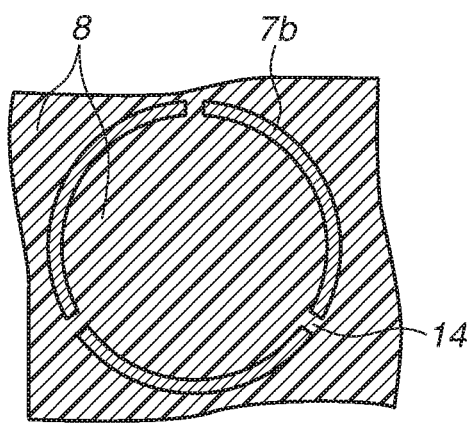
Figure 16D:
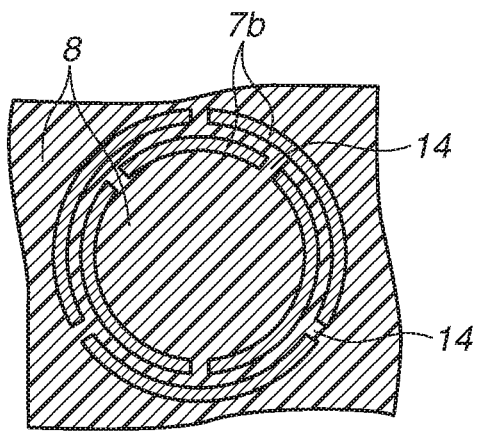

When the resin layer 8 is pressed, stress in an outward expanding direction is applied to the transfer member 10, due to thermal expansion, pressing force, and resin flowing. This stress might result in cracking or a loss of the structure 7b having a loop shape as illustrated in FIG. 16B. Thus, as illustrated in FIG. 16C, if the loop shape is provided with the gap 14, unreliability factors such as cracking or chipping due to the stress can be eliminated. Still, the gap 14 may lead to low resin flow resistance, and thus might result in the resin layer 8 with non-uniform thickness distribution. Thus, as illustrated in FIG. 16D, multiple layers of the structures 7b, having loop shapes and the gaps 14 are provided. More preferably, the gaps 14 in the loop shapes do not overlap with each other. Thus, the resin layer 8 can be prevented from having non-uniform thickness distribution.

EXAMPLES

The present disclosure is described more in detail below using Examples.

Example 1 is described. Liquid ejection head chips were manufactured through the method illustrated in FIG. 2. First, as illustrated in FIG. 2A, the pattern-forming material 7a and the structure 7b were provided on the single crystal silicon substrate 2. The pattern-forming material 7a and the structure 7b were formed by applying positive photosensitive resin (product name: ODUR-1010A, manufactured by TOKYO OHKA KYOGYO Co., Ltd.) on the substrate 2, and patterning the resin by photolithography. In the cross-sectional view in FIG. 2, the width of the pattern-forming material 7a was set to 0.2 mm and the width of the structure 7b was set to 1.0 mm. The surface of the wafer was designed to have a circular shape with a diameter of 200 mm and the structure 7b having a loop shape was provided along the circumference of the wafer. More specifically, the structure 7b was designed to have a loop shape with a width of 1.0 mm.

Next, the wafer was placed in a vacuum chamber of a device including a pressing member with a flat plate shape provided within the vacuum chamber. The transfer member 10 including the resin layer 8 and the supporting member 9 was disposed facing the wafer and the pressing member 11 thereon as illustrated in FIG. 2B. The pressing member 11 was designed to have a pressing surface having a circular shape and a diameter of 200 mm. The resin layer 8 was formed with cation polymerization type epoxy resin (negative photosensitive resin) on the supporting member 9 made of polyethylene terephthalate.

Next, the vacuuming was performed to achieve 100 Pa, and then the pressing member 11 and the wafer were set to be at 80° C. Then, the pressing member 11 pressed the surface of the resin layer 8 as illustrated in FIG. 2C. The pressing was performed at 15 kN, and the pressing member 11 was separated after a predetermined period of time has elapsed. Then, atmospheric release was performed. Subsequently, the supporting member 9 was peeled off, whereby the state illustrated in FIG. 2D was achieved.

Then, the ejection ports 5 were formed in the resin layer 8 by photolithography so that the resin layer 8 serves as the ejection port forming member 4, and the structure 7b was exposed, as illustrated in FIG. 2E.

Next, a back surface of the substrate 2 was irradiated with deep ultraviolet (UV) light, and the structure 7b and the pattern-forming material 7a were removed with ethyl cellosolve, whereby the flow path 6 was formed as illustrated in FIG. 2F. Finally, the supply port 3 as illustrated in FIG. 1 (not illustrated in the figure) was formed, and the wafer was cut into individual liquid ejection head chips. Thus, the liquid ejection head chips were manufactured.

<Comparative Example 1>

A liquid ejection head was manufactured in the same manner as in Example 1, except that the structure 7b was not formed.

<Results of Example 1 and Comparative Example 1>

The thickness of the resin layer 8 was measured at the center of the circular wafer (center portion) and at a position 10 mm toward the inner side from the circumference (circumference portion) with respect to the liquid ejection head manufactured in Example 1 and Comparative Example 1.

In Example 1, a ratio of the center portion to the circumference portion was 1.01 with a pressing time of 30 seconds. The ratio was 0.99 with a pressing time of 60 seconds, and was 0.98 with a pressing time of 180 seconds.

In Comparative Example 1, the ratio was 0.94 with a pressing time of 10 seconds, and was 0.91 with a pressing time of 60 seconds.

These results of Example 1 and Comparative Example 1 indicate that the macro unevenness due to the reduced thickness of the resin layer 8 in the portion around the circumference of the wafer, was successfully prevented with the structure 7b provided.

Example 2 is described below. Liquid ejection head chips were manufactured with the method illustrated in FIG. 8. A difference from Example 1 is that the resin layer 8 was formed by spin coating a composition of cation polymerization type epoxy resin (negative photosensitive resin). Another difference is that the width of the structure 7b (the length in a direction from the wafer center to the circumference) was set to 3 mm. The liquid ejection head chips were manufactured in the same manner as in Example 1 except for these conditions. Also in the liquid ejection head chips manufactured in Example 2, the unevenness on the resin layer surface was prevented, as in Example 1.

Example 3 is described below. Liquid ejection head chips were manufactured by the method illustrated in FIG. 10. Differences from Example 2 are that the diameter of the pressing surface of the pressing member 11 was set to 197 mm, and the end portion of the pressing member 11 was positioned above the structure 7b. The liquid ejection head chips were manufactured in the same manner as in Example 2 except for these conditions. The liquid ejection head chips manufactured in Example 3 has prevented the unevenness on the resin layer surface much more than the liquid ejection head chips manufactured in Example 2.

Example 4 is described below. Liquid ejection head chips were manufactured with the method illustrated in FIG. 12. First of all, the pattern-forming material 7a was provided on the single crystal silicon substrate 2 as illustrated in FIG. 12A. The pattern-forming material 7a was formed by applying positive photosensitive resin (product name: ODUR-1010A, manufactured by TOKYO OHKA KYOGYO Co., Ltd.) on the substrate 2, and patterning the resin by photolithography.

Next, as illustrated in FIG. 12B, the resin layer 8 was formed by spin coating a composition of cation polymerization type epoxy resin (negative photosensitive resin).

Next, the structure 7b was obtained with the end portion of the resin layer 8 exposed as illustrated in FIG. 12C. In the cross-sectional view in FIG. 12, the width of the pattern-forming material 7a was set to 0.2 mm, and the width of the structure 7b was set to 1.0 mm. The surface of the wafer was designed to have a circular shape with a diameter of 200 mm and the structure 7b having a loop shape was provided along the circumference of the wafer. More specifically, the structure 7b was designed to have a loop shape with a width of 1.0 mm.

Next, the wafer was placed in a vacuum chamber of a device including a pressing member with a flat plate shape provided within the vacuum chamber. Next, the vacuuming was performed to achieve 100 Pa, and the pressing member 11 and the wafer were set to be at 80° C. Then, the pressing member 11 pressed the surface of the resin layer 8 as illustrated in FIG. 12D. The pressing member 11 was designed to have a pressing surface having a circular shape and a diameter of 200 mm. The pressing was performed at 15 kN, and the pressing member 11 was separated after a predetermined period of time has elapsed. Then, atmospheric release was performed. Subsequently, the supporting member 9 was peeled off, whereby the state illustrated in FIG. 12E was achieved.

Then, the ejection ports 5 were formed in the resin layer 8 by photolithography so that the resin layer 8 serves as the ejection port forming member 4 as illustrated in FIG. 12F. Next, the back surface of the substrate 2 was irradiated with deep UV light, and the structure 7b and the pattern-forming material 7a were removed with ethyl cellosolve, whereby the flow path 6 was formed. Finally, the supply port 3 was formed in the substrate 2 (not illustrated in the figure), and the wafer was cut into individual liquid ejection head chips. Thus, the liquid ejection head chips were manufactured.

Also in the liquid ejection head chips manufactured in Example 4, the unevenness on the resin layer surface was prevented, as in Example 1.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-040840, filed Mar. 3, 2017, which is hereby incorporated by reference herein in its entirety.

What is claimed is:

1. A pressing method for pressing a surface of a resin layer, the method, comprising pressing a surface of a resin layer of a wafer with a pressing member, which is to be divided into a plurality of liquid ejection head chips, the wafer including a substrate and the resin layer to serve as an ejection port forming member provided on the substrate,
wherein the pressing of the surface of the resin layer is performed by placing a structure closer to a circumference of the wafer than to an area that becomes the plurality of liquid ejection head chips on the substrate, the structure being in contact with the resin layer.

2. The pressing method for pressing a surface of a resin layer according to claim 1, wherein a transfer member including a supporting member and the resin layer supported by the supporting member is prepared to face the substrate, and the surface of the resin layer is pressed across the supporting member with the resin layer of the transfer member transferred onto the substrate by the pressing member.

3. The pressing method for pressing a surface of a resin layer according to claim 2, wherein the transfer member is a dry film.

4. The pressing method for pressing a surface of a resin layer according to claim 2, wherein photosensitive resin is applied on the supporting member and pattern exposure is performed on the photosensitive resin to form the structure and the resin layer from the photosensitive resin.

5. The pressing method for pressing a surface of a resin layer according to claim 4, wherein the photosensitive resin is negative photosensitive resin.

6. The pressing method for pressing a surface of a resin layer according to claim 1, wherein the pressing member presses the surface of the resin layer, after the resin layer has been formed on the substrate.

7. The pressing method for pressing a surface of a resin layer according to claim 6, wherein photosensitive resin is applied on the substrate and pattern exposure is performed on the photosensitive resin to form the structure and the resin layer from the photosensitive resin.

8. The pressing method for pressing a surface of a resin layer according to claim 6, wherein photosensitive resin is applied on the substrate, pattern exposure is performed on the photosensitive resin, a portion of the photosensitive resin cured by the pattern exposure is obtained as the structure, a portion of the photosensitive resin not cured by the pattern exposure is removed, and the resin layer is further formed on the substrate.

9. The pressing method for pressing a surface of a resin layer according to claim 1, wherein the pressing the surface of the resin layer is performed with a width of a pressing surface of the pressing member for pressing the surface of the resin layer set to be smaller than a width of a surface of the substrate in such a manner that the pressing member has an end portion overlapping with the structure as the surface of the substrate is viewed from the above, when the pressing is performed.

10. The pressing method for pressing a surface of a resin layer according to claim 1, wherein the pressing member has a flat surface for pressing the surface of the resin layer.

11. The pressing method for pressing a surface of a resin layer according to claim 1, wherein the structure has a shape which follows a circumference of the wafer.

12. The pressing method for pressing a surface of a resin layer according to claim 11, wherein the structure has a loop shape which follows the circumference of the wafer.

13. The pressing method for pressing a surface of a resin layer according to claim 12, wherein the structure has a continuous and seamless shape which follows the circumference of the wafer.

14. The pressing method for pressing a surface of a resin layer according to claim 1, wherein multiple layers of the structures are provided along a direction toward a circumference of the wafer with a gap provided between the structures.

15. The pressing method for pressing a surface of a resin layer according to claim 14, wherein each of the multiple layers of the structures has a gap, and positions of the gaps do not overlap.

16. The pressing method for pressing a surface of a resin layer according to claim 1, wherein the structure in a non-chip-effective area has a higher volume density than a pattern-forming material in a chip-effective area, the chip effective area being an area that becomes the plurality of liquid ejection head chips, the non-chip-effective area being an area that does not become the plurality of liquid ejection head chips.

17. The pressing method for pressing a surface of a resin layer according to claim 1, wherein a pattern-forming material that is removed to be a liquid flow path is formed on an area, on the surface of the substrate, which becomes the plurality of liquid ejection head chips.

18. The pressing method for pressing a surface of a resin layer according to claim 17, wherein the structure shows a higher hardness than the pattern-forming material.

19. A manufacturing method for a liquid ejection head chip, the manufacturing method, comprising pressing a surface of a resin layer of a wafer using a pressing member, which is to be divided into a plurality of liquid ejection head chips, the wafer including a substrate and the resin layer to serve as an ejection port forming member provided on the substrate, wherein the pressing the surface of the resin layer is performed by positioning a structure closer to a circumference of the wafer than to an area that becomes the plurality of liquid ejection head chips on the substrate, the structure being in contact with the resin layer, and wherein ejection ports are formed in the resin layer after the surface of the resin layer has been pressed so that the resin layer serves as the ejection port forming member.

20. The manufacturing method for a liquid ejection head chip according to claim 19, wherein the wafer is divided into the plurality of liquid ejection head chips after the ejection ports have been formed in the resin layer.

* * * * *